United States Patent [19]

Ihara et al.

[11] Patent Number: 5,789,761
[45] Date of Patent: Aug. 4, 1998

[54] THIN-FILM TRANSISTOR ARRAY HAVING LIGHT SHADING FILM AND ANTIREFLECTION LAYER

[75] Inventors: Hirofumi Ihara; Kohji Nakashima; Susumu Ohi; Shin Koide, all of Tokyo, Japan

[73] Assignee: NEC Corporation, Tokyo, Japan

[21] Appl. No.: 645,816

[22] Filed: May 14, 1996

[30] Foreign Application Priority Data

May 19, 1995 [JP] Japan ................................ 7-121130
Jul. 4, 1995 [JP] Japan ................................ 7-168561

[51] Int. Cl.⁶ ................ G02F 1/1343; H01L 29/04; H01L 37/036
[52] U.S. Cl. ................ 257/59; 257/72; 349/43; 349/44; 349/110; 349/137
[58] Field of Search ................ 257/59, 72; 359/56, 359/59, 74; 249/43, 44, 110, 137

[56] References Cited

U.S. PATENT DOCUMENTS

| | | | |
|---|---|---|---|
| 4,877,995 | 10/1989 | Thioulouse et al. | 427/66 |
| 5,486,485 | 1/1996 | Kim et al. | 359/57 |
| 5,488,246 | 1/1996 | Hayashide et al. | 257/336 |
| 5,532,850 | 7/1996 | Someya et al. | 359/59 |

FOREIGN PATENT DOCUMENTS

| | | |
|---|---|---|
| 63-276031 | 11/1988 | Japan. |
| 64-42634 | 2/1989 | Japan. |
| 2-308131 | 12/1990 | Japan. |
| 3-123320 | 5/1991 | Japan. |
| 3-274028 | 12/1991 | Japan. |
| 4-86809 | 3/1992 | Japan. |
| 5-241199 | 9/1993 | Japan. |

*Primary Examiner*—Tom Thomas
*Assistant Examiner*—Fetsum Abraham
*Attorney, Agent, or Firm*—Young & Thompson

[57] ABSTRACT

A thin-film transistor (TFT) array for preventing the light reflected inside a liquid crystal panel from entering a channel layer, while suppressing an increase of stray capacitance. A light shading film and an antireflection film atop source and drain electrodes are made of semiconductor layers and are spaced from each other on a TFT. The reduction in reflected light prevents an increase in an off current and therefore improves the quality of a liquid crystal display.

16 Claims, 4 Drawing Sheets

5,789,761

1

THIN-FILM TRANSISTOR ARRAY HAVING LIGHT SHADING FILM AND ANTIREFLECTION LAYER

BACKGROUND OF THE INVENTION

1. Field of the Invention

The present invention relates to a thin-film transistor array, and particularly to a thin-film transistor (TFT) array used in an active matrix liquid crystal panel.

2. Description of the Prior Art

A liquid crystal display device using a TFT array according to the prior art is described with reference to FIG. 5 and FIG. 6. FIG. 5 is a plan view of a part on which a TFT array of the liquid crystal display device is formed, and FIG. 6 is a sectional view taken along the line B—B of FIG. 5.

In an active matrix liquid crystal panel using a thin-film transistor (TFT) as an active element, an amorphous silicon hydride (a-Si:H) film or the like which can be formed at a comparatively low temperature of about 300° C. is used as a channel layer 102 of the TFT. When light comes into the channel layer 102 which is an active region, carriers are generated in the channel layer 102, and when the transistor is off, the carriers create a leakage current which increase an off current. An increase of the off current causes irregularity in the display and can significantly deteriorate the quality of an active matrix liquid crystal display.

In general, therefore, light is shaded from the TFT by means of a black matrix layer 122 provided on the opposite substrate. However, under a condition of intense light as seen in a projection type display device, incident light detours into the channel layer 102 due to reflection between a metal film used in the TFT and the black matrix layer 122, as shown by a line 141 in FIG. 6.

On the other hand, since aperture efficiency must be increased in order to improve light utilizing efficiency, it is desired to make smaller or remove the black matrix layer 122. In such a case, shading the light on the array substrate is needed in order to prevent an increase of an off current in the presence of incident light. Thus a light shading film 105 is provided on the TFT.

A liquid crystal panel of this structure controls a state of a light crystal 130 to turn on and off the light transmitted by applying an electric field between a pixel electrode 106 provided on a glass substrate 100 and its opposite electrode 121 provided on a glass substrate 120.

A process of manufacturing the liquid crystal panel is described in the following. After a gate electrode 101 composed of a metal film of Cr, Al, and the like is patterned on the glass substrate 100, a gate insulating film 114, a channel layer 102 composed of intrinsic semiconductor amorphous silicon (hereinafter referred to as "a-Si (I)"), a contact layer 107 composed of n-type semiconductor amorphous silicon (hereinafter referred to as "a-Si (n+)") are formed in order on the glass substrate 100. On the glass substrate 100 are then formed a drain electrode 103, a source electrode 104, and an image signal line 112 which are composed of a metal film of Cr, Al, and the like, and a pixel electrode 106. After this a passivation film 115 is formed and then a light shading film 105 is formed to make a TFT array substrate. In the opposite substrate side, an opposite electrode 121 is formed on another glass substrate 120. Eventually, orientation films (not illustrated) are formed on the TFT array substrate and the opposite substrate, respectively. Then, the orientation films are subjected to an orientation process. After a seal pattern is formed on them, the

2 substrates are laminated to each other and are cured, the liquid crystal 130 is injected between the substrates, and then the injection hole is sealed. Thus a liquid crystal panel is completed.

A liquid crystal display device is made by adding a polarizing plate, a driving circuit, a case, and the like to this liquid crystal panel.

In the liquid crystal panel, however, a black matrix layer 122 composed of a metal film of Cr and the like is provided on the opposite substrate in order to improve the quality of the display.

The gate electrode 101 is formed so as to branch from a scanning signal line 111 and the drain electrode 103 is formed so as to be connected to an image signal line 112. Namely, as illustrated, a pattern is formed so that the scanning signal line 111 and the image signal line 112 may intersect perpendicularly to each other and be insulated from each other. A TFT is disposed at the intersection, the gate electrode 101 is connected to the scanning signal line 111, and the drain electrode 103 is connected to the image signal line 112. The plan view in FIG. 5 shows a gate electrode 101, a channel layer 102, a drain electrode 103, a source electrode 104, a light shading film 105, a pixel electrode 106, an adjoining scanning signal line ill and an adjoining image signal line 112, but omits the other parts.

In the event an active matrix liquid crystal panel is used as a projection type display device, light is applied from the glass substrate 120 side on which the opposite electrode 121 is formed. After the light 141 applied from the glass substrate 120 side is reflected by the inside face of the glass substrate 100 and reflected by metal films of the source electrode 104, the drain electrode 103, and the like, and then reflected by the black matrix layer 122, the light 141 enters the channel layer 102 which is an active region. The light shading film 105 is formed in order to prevent deterioration in the quality of the display by suppressing an increase of the off current due to reflection of the incident light.

The light shading film may be a conductive material, such as a metal film or a semiconductor film, or an insulating resin film.

If a highly conductive metal film is the light shading film 105, there are the following two problems.

The first problem is that a stray capacitance is formed between the drain electrode and the source electrode. When there is a stray capacitance (and stray capacitance may exist even while the TFT is off), the stray capacitance changes the voltage of the pixel electrode 106 and thus causes irregularity in brightness and crosstalk, thereby deteriorating the quality of the display.

Thus, in order to reduce the stray capacitance, a composition where a light shading film made of a metal film has been proposed, for example, by Japanese Unexamined Patent Publication (Kokai) No. 64-42634. This technique reduces the stray capacitance to some degree, but not completely.

The second problem is that an electrically charged light shading film changes the operating voltage of the TFT causing irregularities in the display. Thus, in order to prevent the electrically charging phenomenon, the technique of connecting the light shading film to a scanning signal line or an image signal line has been proposed by Japanese Unexamined Patent Publication (Kokai) No. 63-276031. However, this technique increases the stray capacitance in comparison to the case where such a connection is not made and deteriorates the quality of the display without solving the first problem.

When a semiconductor film is used as the light shading film, the stray capacitance is less, but its shading effect is less than a metal film.

Techniques for using an insulating resin film as a light shading film have been disclosed, for example, in Japanese Unexamined Patent Publication (Kokai) Nos. 2-308131, 3-123320, 4-86809, but they have a problem that since the light shading film is very thick, its thickness control and patterning control are poor in accuracy and deteriorate the quality of the display due to irregular orientation caused by its irregular thickness and patterning.

A composition where an optical antireflection film is formed on the opposite substrate has been proposed as a technique for suppressing light reflection inside the display panel by Japanese Unexamined Patent Publication (Kokai) No. 3-274028. In this composition, since an optical antireflection film is formed on the opposite substrate, if there is slippage between the TFT array substrate and the opposite substrate when they are laminated to each other, light comes directly into the channel part. Further, since an area of the optical antireflection film is increased to account for the lamination slippage, a reduction in aperture efficiency cannot be avoided in comparison to a device in which a light shading film is provided on the TFT array substrate.

Furthermore, a substrate where a light absorbing layer composed of a conductive material is provided on an image signal line through an insulating layer has been disclosed in Japanese Unexamined Patent Publication (Kokai) No. 5-241199. However, this technique prevents the light reflected by wiring from coming into an adjoining pixel and causing a spurious signal, and does not contribute to reduction of an off current.

SUMMARY OF THE INVENTION

An object of the invention is to provide a thin-film transistor array for preventing reflected light inside a liquid crystal panel from reaching a channel layer as well as suppressing an increase of stray capacitance caused by providing a conductive light shading film on a TFT.

In a thin-film transistor array according to the present invention, an antireflection film made of the same material as a light shading film is provided on an insulating film on a source electrode and a drain electrode of the thin film transistor.

The light shading film and the antireflection film are preferably made of amorphous silicon and are more preferably formed separately from each other.

The light shading film and the antireflection film can be made of the same layer by means of the same patterning process.

DESCRIPTION OF THE PREFERRED EMBODIMENTS

Figure 1:
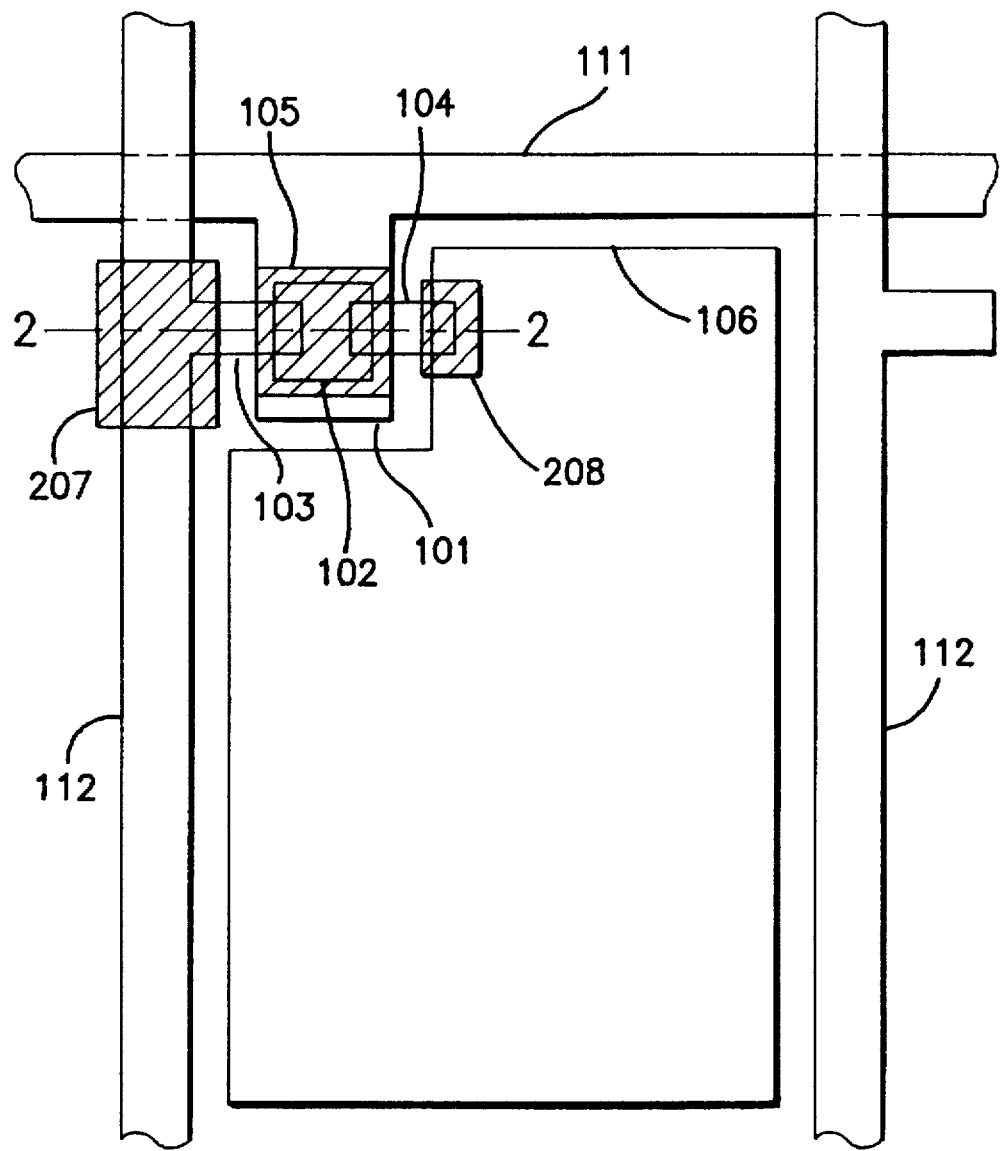
FIG. 1 is a plan view of the present invention.
Figure 2:
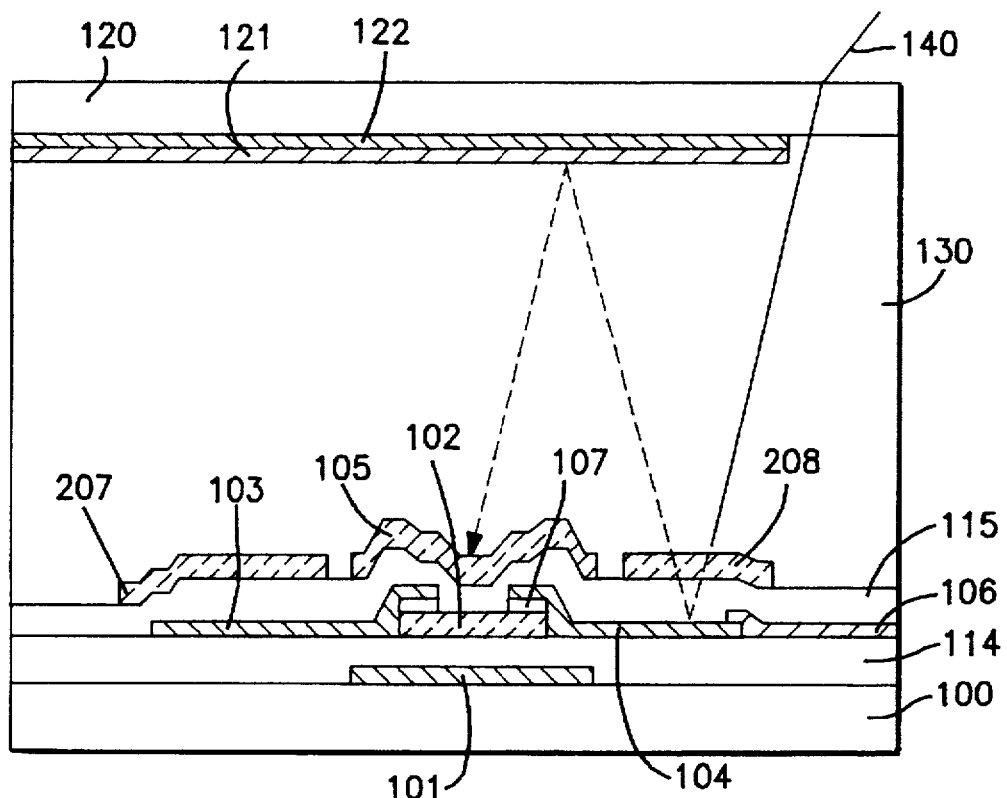
FIG. 2 is a sectional view taken along the line 2—2 of FIG. 1 to show the first embodiment of the invention.

Referring to FIG. 1 and FIG. 2, a composition as well as a manufacturing process of the device are described in the following.

After a gate electrode 101 and a scanning signal line 111 composed of a metal film of Cr, Al, and the like are patterned on a transparent insulating substrate 100 such as a glass substrate, a gate insulating film 114, a channel layer 102 composed of intrinsic semiconductor amorphous silicon (hereinafter referred to as "a-Si (I)"), and a contact layer 107 composed of n type semiconductor amorphous silicon (hereinafter referred to as "a-Si (n+)") are formed in order on the glass substrate 100. On the glass substrate 100 are then formed a drain electrode 103, a source electrode 104, and an image signal line 112 which are composed of a metal film of Cr, Al, and the like, and a pixel electrode 106 composed of a transparent conductive material. After this a passivation film 115 composed of a silicon nitride film and the like is formed and then according to the invention, a light shading film 105 and an antireflection multilayer films 207 and 208 are formed at the same time to make a TFT array substrate.

In the opposite substrate side, an opposite electrode 121 is formed on a transparent insulating substrate 120 of glass or the like after a black matrix layer 122 composed of a metal film of Cr and the like is provided on the substrate 120.

Eventually, orientation films (not illustrated) are formed on the TFT array substrate and the opposite substrate, respectively. Then, the orientation films are subjected to an orientation process. After a seal pattern is formed on them, the substrates are laminated to each other and are cured, a liquid crystal 130 is injected between the substrates, and then the injection hole is sealed. Thus a liquid crystal panel is completed.

In this embodiment, the light shading film 105 and the antireflection films 207 and 208 are made of the same a-Si (I) as the channel layer 102 by means of a plasma CVD method, and these films, respectively, are formed independently from one another, as illustrated. These films are made 300 to 500 nm in thickness in order to attain a light shading ability.

When this active matrix liquid crystal panel is used as a projection type display device, light is applied from the glass substrate 120 side. In this case, as shown in FIG. 2, after the light 140 applied from the glass substrate 120 side is reflected by the inside face of the glass substrate 100, is reflected by the metal films of the source electrode 104, the drain electrode 103, and the like, and then is reflected by the black matrix layer 122, the light 140 enters the channel layer 102 which is an active region. The light shading film 105 is formed in order to prevent deterioration of the quality of the display by shading the incident light, thereby suppressing an increase of the off current. In this embodiment, since the light shading film 105 is made of a-Si (I), the light shading film 105 alone cannot completely absorb the light coming toward the channel layer 102.

Therefore, the antireflection films 207 and 208 made of a-Si (I) are provided together with the light shading film 105 on the source electrode 104 and the drain electrode 103. Thanks to these films, it is possible to reduce the intensity of the reflected light inside the panel and completely shut out the light coming toward the channel layer 102 via the light shading film 105.

Since the light shading film 105 and the antireflection film 207 are made of a-Si (I), formation of a stray capacitance between the drain electrode 103 and the source electrode 104 is suppressed in comparison with a case where the films are made of metal. Further, since the light shading film 105 and the antireflection multilayer film 207 are spaced apart from each other, the stray capacitance is further reduced.

By preventing the incident light from coming into the channel layer 102 through the use of the light shading film 105 and the antireflection film 207 on the TFT, it is possible to reduce the off current and accordingly improve the quality of the liquid crystal display.

Figure 3:
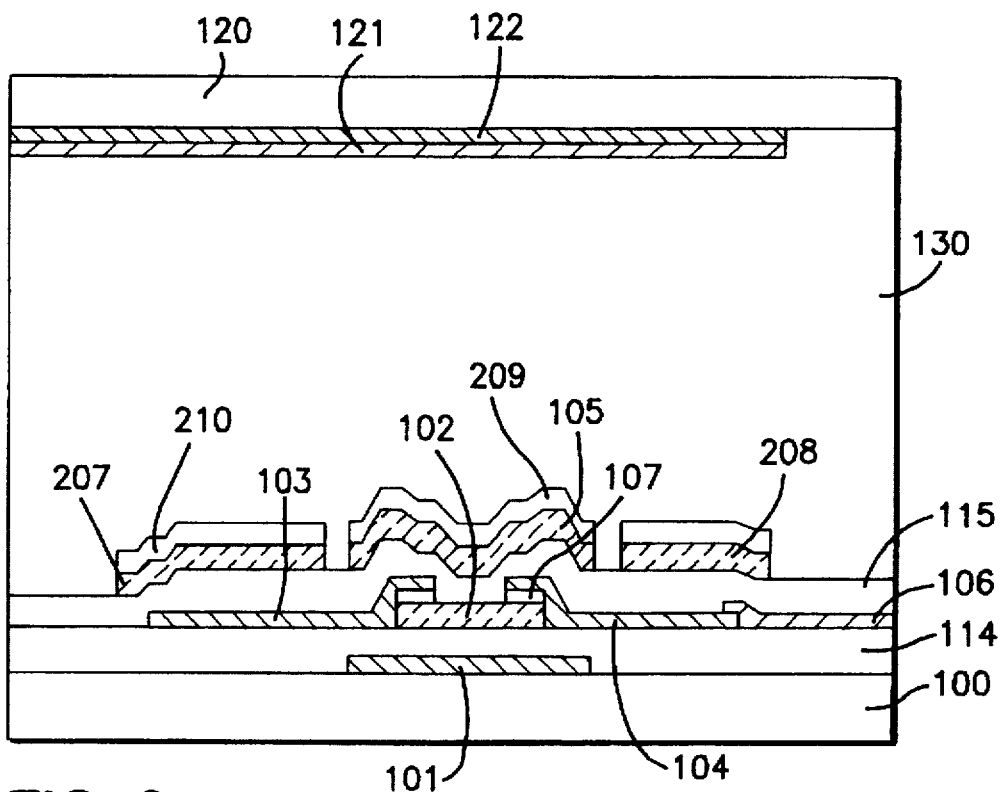
FIG. 3 is a sectional view taken along the line 2—2 of FIG. 1 to show the second embodiment of the invention.

FIG. 3 is a sectional view of the second embodiment of a liquid crystal display device of the invention. Its plan view is the same as the first embodiment. In this embodiment, a second light shading film 209 and second antireflection films 210 and 212 are additionally formed, respectively, on the light shading film 105 and the antireflection films 207 and 208.

The light shading film 105 and the antireflection films 207 and 208 are made of the same a-Si (I) as the channel layer 102 in the same manner as the first embodiment. The light shading film 209 and the antireflection films 210 and 212 are made of a Si (N+), to which an n-type impurity such as phosphorus or the like which is 1×10 to the 20th power atoms/cm$^3$ or higher in density is added similarly in a manner similar to the contact layer 107. As in the case of the channel layer 102 and the contact layer 107, the a-Si (I) and the a-Si (N+) forming the light shading films 105 and 209, and the antireflection films 207 and 210, and 208 and 212 are formed consecutively in order by means of a plasma CVD method. These light shading films 105 and 209, and these antireflection films 207, 208, 210, and 212 are formed through the same patterning process.

According to this embodiment, the light shading film 209 and the antireflection films 210 and 212 made of a-Si (n+), which are 100 to 400 nm in thickness, are provided on the light shading film 105 and the antireflection films 207 and 208, respectively. Since the a-Si (n+) has a lower transmittance in a range of such long wavelength as red light in comparison with the a-Si (I), the a-Si (n+) has the advantage of improving a light shading effect for a light of long wavelength.

Figure 4:
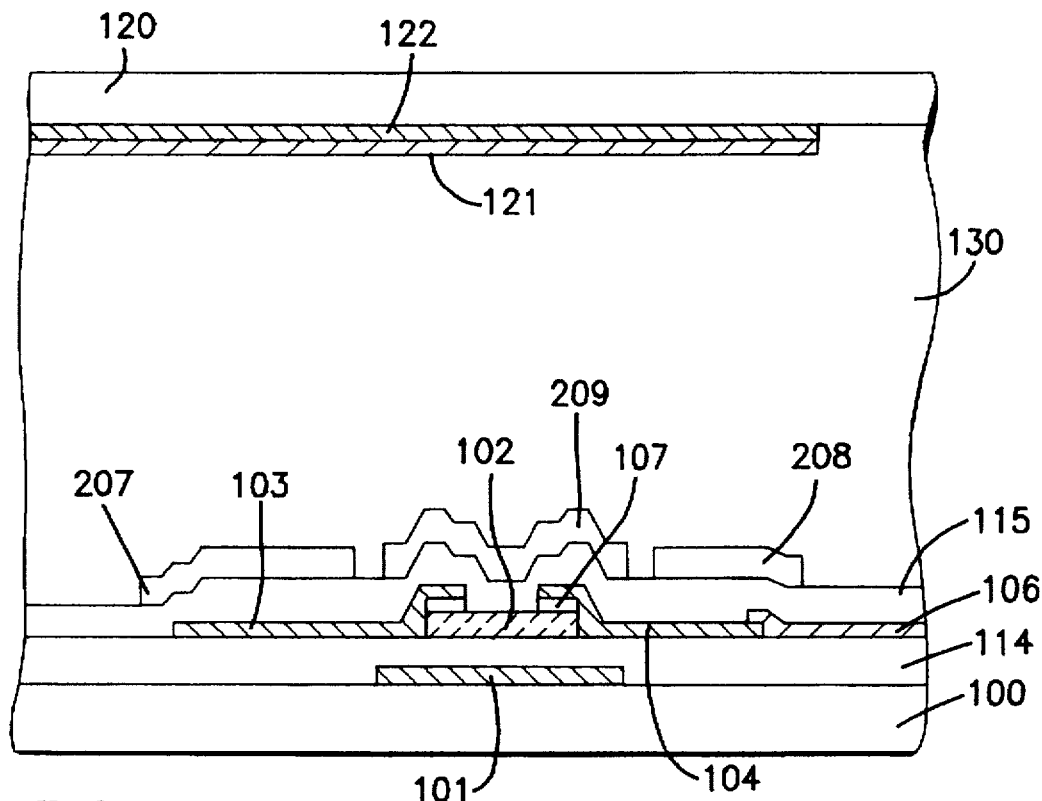
FIG. 4 is a sectional view taken along the line 2—2 of FIG. 1 to show the third embodiment of the invention.
Figure 6:
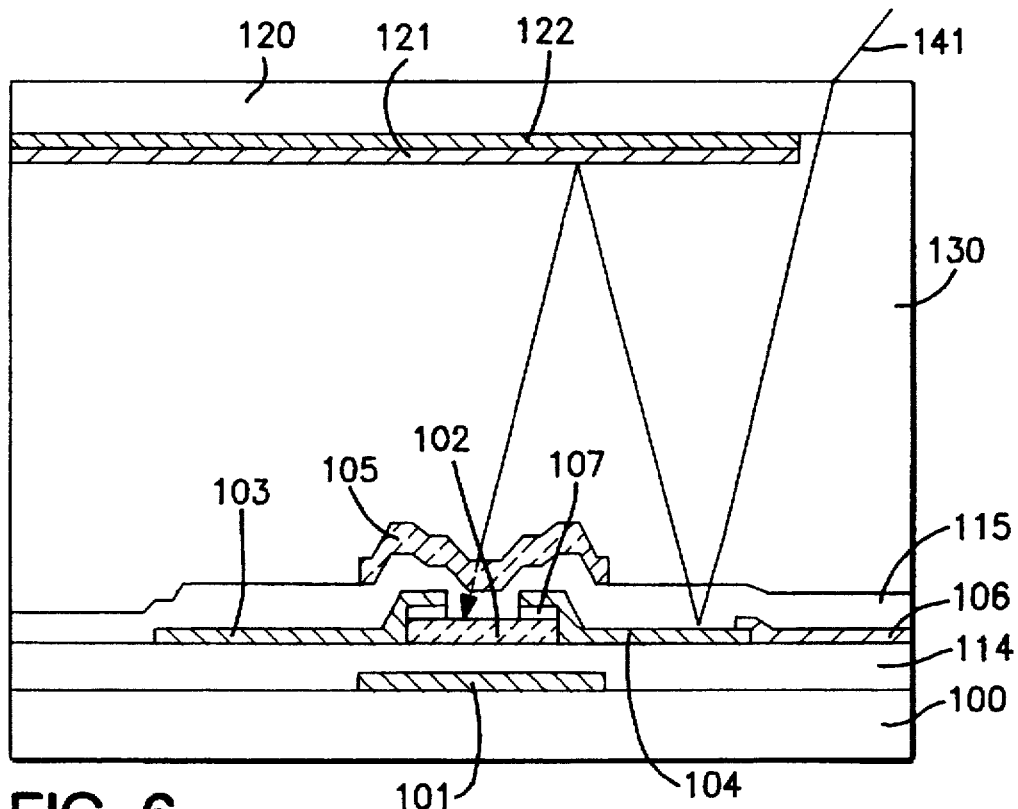
FIG. 6 is a sectional view taken along the line 6—6 of FIG. 5.
Figure 5:
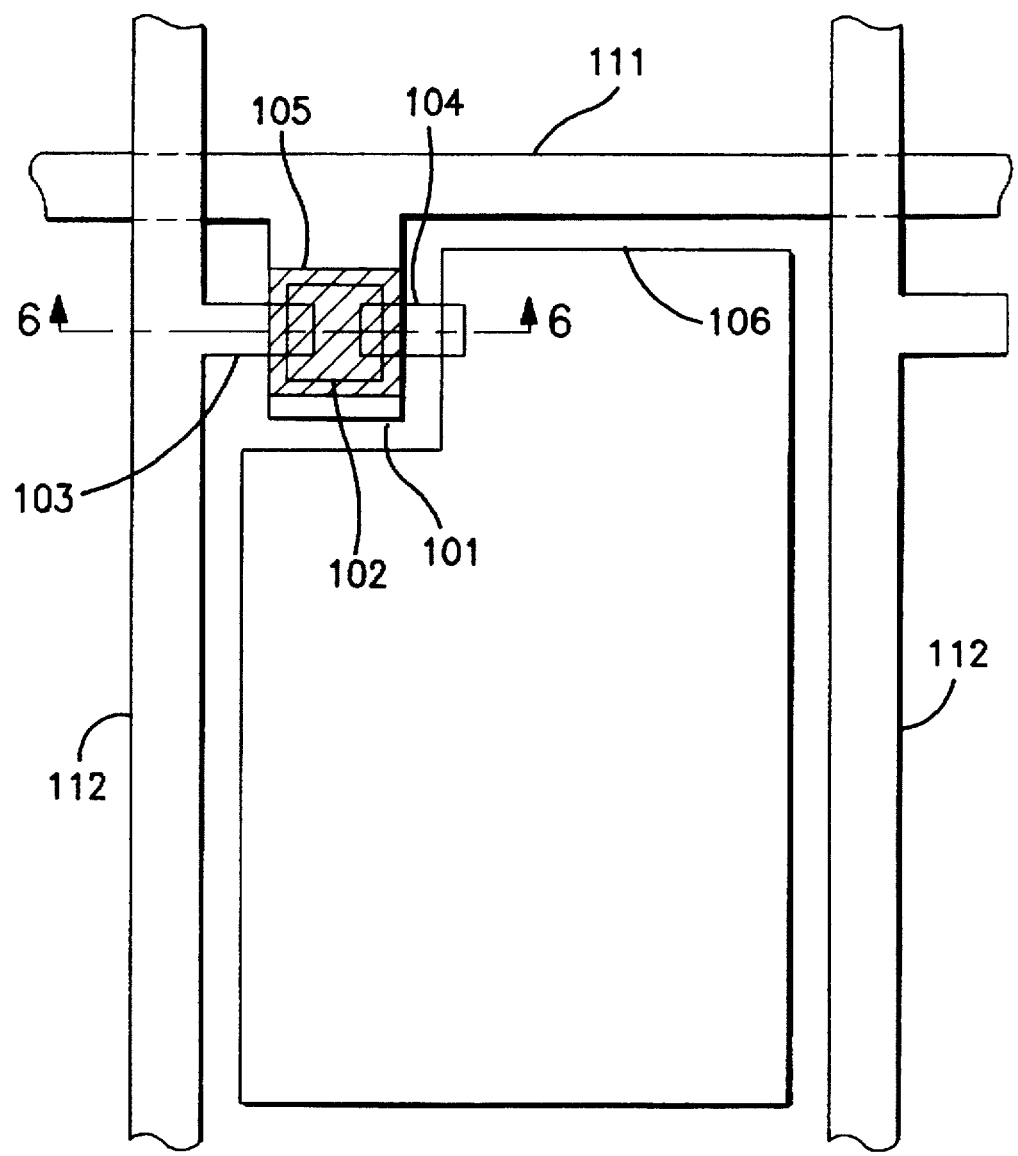
FIG. 5 is a plan view of a prior art.

The above-mentioned embodiment shows an example where a light shading film and an antireflection film have, respectively, two layers of a-Si (I) and a-Si (n+), but these films can also manage with a single layer of a-Si(n+) as shown in FIG. 4. Namely, each of the light shading film 209 and antireflection film 208 shown in FIG. 4 has a single layer of a-Si (n+).

Since an amount of light transmitted through the light shading film varies according to intensity and wavelength of the incident light, it is desirable to determine by an experiment whether the light shading film and the antireflection film, respectively, are to be made of two layers or a single layer.

As described above, the present invention can reduce an off current and therefore improve the quality of a liquid crystal display by preventing the light reflected inside a display panel from entering a channel layer by providing both a light shading film and an antireflection film on a TFT.

And the invention has an advantage of suppressing formation of a stray capacitance between a drain electrode and a source electrode by making both of a light shading film and an antireflection film, respectively, of semiconductor layers spaced from each other.

What is claimed is:

1. A thin-film transistor array comprising:

a plurality of scanning signal lines and a plurality of data signal lines disposed on a transparent substrate;

a thin-film transistor disposed at each point of intersection of said scanning signal lines and said data signal lines;

a light shading film of semiconductor on an insulating film on an active layer of said thin-film transistor; and antireflection films of of semiconductor on an insulating film on source and drain electrodes of said thin-film transistor, the combination of said light shading film and said antireflection films suppressing increases in off current and stray capacitance in the array.

2. A thin-film transistor array as defined in claim 1, wherein said light shading film and said antireflection film are spaced apart from each other.

3. A thin-film transistor array as defined in claim 1, wherein said light shading film and said antireflection film are formed by using the same patterning process for the same layer.

4. A thin-film transistor array as defined in claim 1, wherein said semiconductor is amorphous silicon.

5. A thin-film transistor array as defined in claim 1, wherein a second light shading film and a second antireflection film, respectively, are on said light shading film and said antireflection film.

6. A thin-film transistor array as defined in claim 5, wherein said second light shading film and said second antireflection film, respectively, are semiconductor layers containing an impurity of high density.

7. A thin-film transistor array comprising:

a plurality of scanning signal lines and a plurality of data signal lines disposed on a transparent substrate;

a thin-film transistor disposed at each point of intersection of said scanning signal lines and said data signal lines;

a first light shading film on an insulating film on an active layer of said thin-film transistor;

first antireflection films on an insulating film on source and drain electrodes of said thin-film transistor;

a second light shading film on said first light shading film; and second antireflection films on said first antireflection films.

8. A thin-film transistor array as defined in claim 7, wherein said second light shading film and said second antireflection film, respectively, are semiconductor layers containing an impurity of high density.

9. A thin-film transistor array comprising:

a plurality of scanning signal lines and a plurality of data signal lines disposed on a transparent substrate;

a thin-film transistor disposed at each point of intersection of said scanning signal lines and said data signal lines;

a light shading film of amorphous silicon on an insulating film on an active layer of said thin-film transistor; and antireflection films of amorphous silicon on an insulating film on the source and drain electrodes of said thin-film transistor.

10. A thin-film transistor having an active region between source and drain electrodes, the transistor comprising:

a light shading film on an insulating film on the active layer of the thin-film transistor; and antireflection films on an insulating film on the source and drain electrodes of the thin-film transistor, the combination of said light shading film and said antireflection films suppressing increases in off current in the transistor.

11. A thin-film transistor as defined in claim 10, wherein said light shading film and said antireflection film are, respectively, semiconductor layers.

12. A thin-film transistor as defined in claim 11, wherein said semiconductor layers comprise an impurity of high density.

13. A thin-film transistor as defined in claim 11, wherein said semiconductor layers are amorphous silicon.

14. A thin-film transistor as defined in claim 10, wherein said light shading film and said antireflection film are spaced apart from each other.

15. A thin-film transistor as defined in claim 10, wherein said light shading film and said antireflection film are the same material.

16. A thin-film transistor as defined in claim 10, comprising a first of said antireflection films on the insulating film on the source electrode and a second of said antireflection films on the insulating film on the drain electrode, and wherein said first and second antireflection films and said light shading film are all spaced apart from each other.

* * * * *